US 011943906B2

(12) United States Patent
Sanders

(10) Patent No.: US 11,943,906 B2
(45) Date of Patent: Mar. 26, 2024

(54) FLEXIBLE ELECTROMAGNETIC SHIELDING THAT ATTENUATES ELECTROMAGNETIC INTERFERENCE

(71) Applicant: Microsoft Technology Licensing, LLC, Redmond, WA (US)

(72) Inventor: Jesse William Sanders, Bethesda, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/827,701

(22) Filed: May 28, 2022

(65) Prior Publication Data

US 2023/0389245 A1 Nov. 30, 2023

(51) Int. Cl.
| | |
|---|---|
| H05K 9/00 | (2006.01) |
| B29C 70/88 | (2006.01) |
| B32B 7/12 | (2006.01) |
| B32B 15/20 | (2006.01) |

(52) U.S. Cl.
CPC ......... *H05K 9/0088* (2013.01); *B29C 70/882* (2013.01); *B32B 7/12* (2013.01); *B32B 15/20* (2013.01); *H05K 9/0041* (2013.01); *H05K 9/0043* (2013.01); *H05K 9/0086* (2013.01)

(58) Field of Classification Search
CPC .. H05K 9/0088; H05K 9/0086; H05K 9/0041; H05K 9/0043
See application file for complete search history.

(56) References Cited

U.S. PATENT DOCUMENTS

| | | | | |
|---|---|---|---|---|
| 4,678,699 | A * | 7/1987 | Kritchevsky | B29C 70/885 428/175 |
| 5,431,974 | A * | 7/1995 | Pierce | H05K 9/0041 55/471 |
| 5,503,887 | A * | 4/1996 | Diaz | B29C 70/882 428/116 |
| 2003/0192715 | A1* | 10/2003 | Lambert | H05K 9/0041 174/355 |
| 2006/0150599 | A1* | 7/2006 | Johnson | B01D 39/2037 55/524 |
| 2007/0095567 | A1* | 5/2007 | Boyce | H05K 9/0041 174/383 |
| 2012/0285738 | A1* | 11/2012 | Cochrane | H05K 9/0045 174/382 |

OTHER PUBLICATIONS

Hexcel Composites, "HexWeb Honeycomb Attributes and Properties", 40 pages.

* cited by examiner

*Primary Examiner* — Hung V Ngo
(74) *Attorney, Agent, or Firm* — Calfee, Halter & Griswold LLP

(57) ABSTRACT

Described herein is electromagnetic shielding that is configured to attenuate electromagnetic interference (EMI) by at least a threshold amount when the EMI has a frequency within a predefined frequency range. The electromagnetic shielding includes a layer of metal, such as aluminum foil, and a layer of thermoplastic polymer fabric (such as woven polyethylene fabric), where the electromagnetic shielding has several apertures that extend therethrough. The electromagnetic shielding is at least partially draped over electronic equipment that is to be shielded from EMI.

20 Claims, 6 Drawing Sheets

FLEXIBLE ELECTROMAGNETIC SHIELDING THAT ATTENUATES ELECTROMAGNETIC INTERFERENCE

BACKGROUND

As more and more data processing is undertaken at data centers, it is becoming increasingly important to secure electronic equipment from security breaches. An example security breach is a stand-off attack, where an attacker purposefully generates electromagnetic interference (EMI) in connection with controlling or disrupting operation of electronic equipment in the data center. To address such attacks, electromagnetic shielding can be used to shield the electronic equipment from EMI.

A conventional approach for shielding electronic equipment of a data center from EMI is to shield an entire data center, where electromagnetic shielding is constructed along walls, electromagnetic shielding is placed over ductwork, and so forth. In another convention approach, electromagnetic shielding is applied to an entire room of the data center where critical electronic equipment is positioned. For example, to shield an entire data center, walls of the data center are lined with nonmagnetic layers of metal and rigid honeycomb waveguides are affixed to vent openings. Further, specially designed doors that are configured to attenuate EMI are employed. As can be ascertained from the foregoing, shielding an entire data center is a labor-intensive and expensive process.

More recently, special-purpose electromagnetic shielding enclosures that are configured to shield racks of servers in data centers have been developed. These shielding enclosures are made of rigid walls and prevent EMI from exiting the enclosures or entering the enclosures. Such shielding enclosures, however, are often cost-prohibitive and render it difficult for maintenance technicians to access servers in these racks of servers for maintenance, replacement, and so forth. There is currently no relatively inexpensive electromagnetic shielding that allows for individual pieces of electronic equipment to be shielded from EMI while simultaneously allowing for relatively easy access to the electronic equipment for purposes of maintenance, replacement, etc.

SUMMARY

The following is a brief summary of subject matter that is described in greater detail herein. This summary is not intended to be limiting as to the scope of the claims.

Described herein are various technologies pertaining to electromagnetic shielding, use of the electromagnetic shielding, and manufacture of the electromagnetic shielding. The electromagnetic shielding is configured to attenuate electromagnetic interference (EMI) by at least a threshold amount (e.g., between −70 and −90 dB) when the EMI has a frequency within a predefined frequency range (e.g., between 9 kHz and 24 GHz). In an example, the electromagnetic shielding described herein meets IEEE 299 standards. The electromagnetic shielding described herein is advantageous over conventional electromagnetic shielding used in data centers, in that the electromagnetic shielding described herein is configured to shield individually selected electrical devices or a group of selected electrical devices (e.g., a server computing device or a rack of server computing devices); in contrast, conventional approaches include shielding an entire data center or room in the data center. In addition, the electromagnetic shielding described herein is relatively inexpensive to manufacture and install. Still further, the electromagnetic shielding described herein allows for air to pass therethrough, such that cooling requirements for electrical devices in datacenters can be met while the electrical devices are shielded from EMI. Moreover, the electromagnetic shielding described herein can be readily moved, such that a maintenance technician can access electronic equipment that is shielded the electromagnetic shielding.

The electromagnetic shielding described herein is flexible yet sufficiently sturdy to allow for repositioning and movement. The electromagnetic shielding includes a layer of metal (such as aluminum foil), a layer of thermoplastic polymer fabric (such as a woven polyethylene fabric), and an adhesive that bonds the layer of metal to the layer of thermoplastic polymer fabric. The electromagnetic shielding includes several apertures that extend therethrough (through the layer of metal and the layer of thermoplastic polymer fabric). The layer of thermoplastic polymer fabric provides a structural backing for the layer of metal, while the layer of metal and the apertures are configured to attenuate EMI by a threshold amount when the EMI has a frequency within a predefined frequency range. In an example, the apertures are hexagonal and are arranged in a honeycomb pattern, such that the electromagnetic shielding is a honeycomb waveguide. The major diameter of each aperture is between 4 millimeters and 15 millimeters, which can be selected based upon the frequency of EMI that is to be attenuated.

Pursuant to an example, the electromagnetic shielding has multiple layers of metal and multiple layers of thermoplastic polymer fabric, where the layers of metal and thermoplastic polymer fabric alternate throughout a thickness of the electromagnetic shielding. Therefore, for instance, the electromagnetic shielding includes a first metal layer that is adhered to a first thermoplastic polymer layer, a second metal layer that is adhered to the first thermoplastic polymer fabric layer and a second thermoplastic polymer fabric layer, a third metal layer that is adhered to the second thermoplastic polymer fabric layer and a third thermoplastic polymer fabric layer, and so forth. Either a metal layer or a thermoplastic polymer fabric layer can be exposed on an exterior of the electromagnetic shielding. A thickness of the layer of metal is between 1 millimeter and 10 millimeters, and a thickness of the layer of thermoplastic polymer fabric is also between 1 millimeter and 10 millimeters. An overall thickness of the electromagnetic shielding is between 12 millimeters and 26 millimeters.

Again, the metal layer and the apertures are configured to attenuate EMI having frequencies within a predefined range. In addition, the apertures of the electromagnetic shielding allow for airflow through the electromagnetic shielding, such that electronic equipment over which the electromagnetic shielding is draped can be cooled by air that passes through the electromagnetic shielding.

As indicated above, electronic equipment can be shielded from EMI by draping the electromagnetic shielding thereover. In an example, a support mechanism is positioned above electronic equipment that is to be shielded, and the electromagnetic shielding is supported by the support mechanism and draped over the electronic equipment. For instance, the support mechanism is a non-conductive plate and a non-conductive post or rope that is attached to a ceiling, such that the plate is hanging from the ceiling at a desired height from ground. The electromagnetic shielding may then be draped over the electronic equipment, where the electromagnetic shielding is supported by the plate. Thus, the electronic equipment is enclosed by the electromagnetic shielding and a floor upon which the electronic equipment rests. Supports can be employed to ensure that a proper distance is maintained between the electromagnetic shielding and the electronic equipment that is shielded from EMI by the electromagnetic shielding.

The electromagnetic shielding can be manufactured by alternatively adhering a respective layer of metal to a respective layer of thermoplastic polymer fabric until a desired thickness (between 12 millimeters and 26 millimeters) is reached. The different layers are bonded together by way of a suitable adhesive, and subsequently a press is employed to form the apertures through all of the layers. The thermoplastic polymer fabric provides flexibility and structural support to the layers of metal. It can be ascertained that nearly any suitable size of electromagnetic shielding can be constructed and can be designed for a particular space in a data center.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 2:
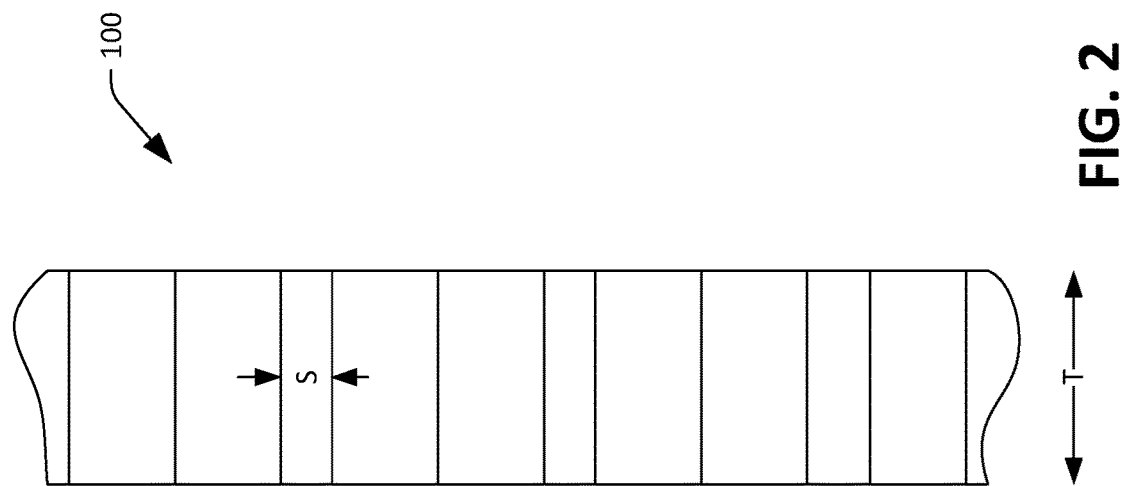
FIG. 2 is a cross sectional view of the electromagnetic shielding.

Various technologies pertaining to electromagnetic shielding, including use and manufacture of electromagnetic shielding, are now described with reference to the drawings, where like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Further, as used herein, the term "exemplary" is intended to mean serving as an illustration or example of something and is not intended to indicate a preference.

Figure 1:
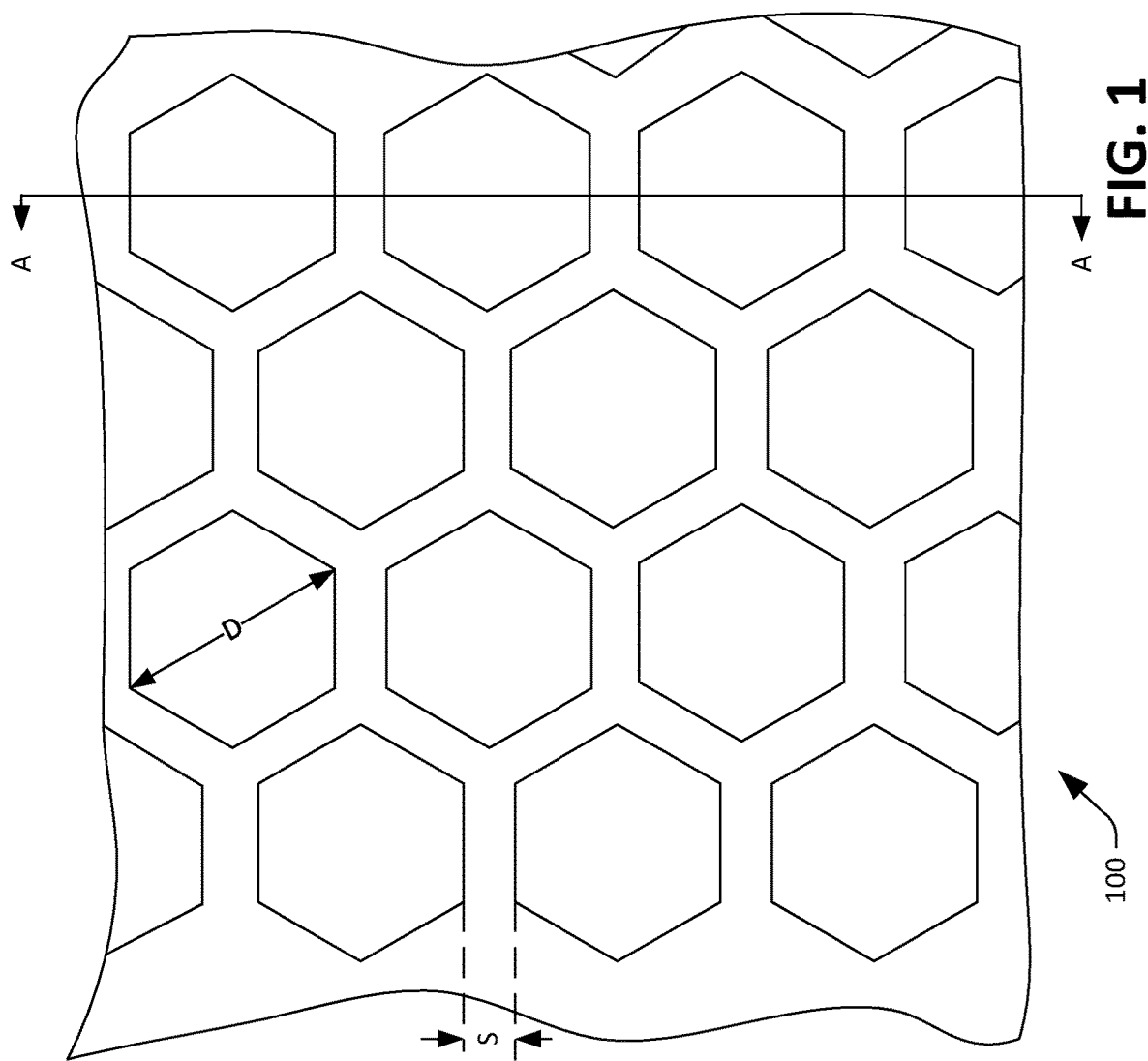
FIG. 1 is an overhead view of electromagnetic shielding.
Figure 3:
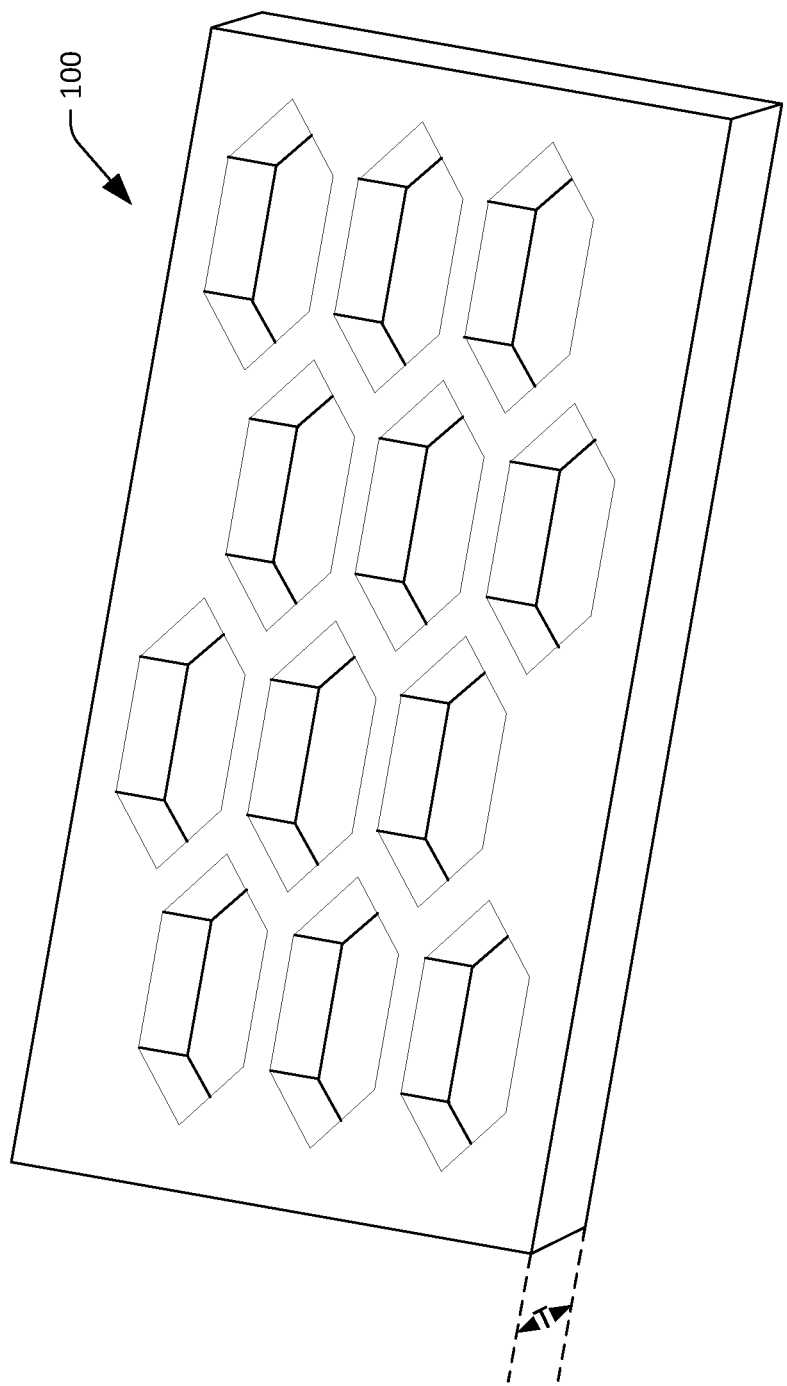
FIG. 3 is a perspective view of the electromagnetic shielding.

With reference now to FIGS. 1-3, electromagnetic shielding 100 is illustrated, where the electromagnetic shielding 100 is particularly well-suited for shielding electronic devices from EMI in data centers. More specifically, FIG. 1 is an overhead view of the electromagnetic shielding 100, FIG. 2 is a cross-sectional view of the electromagnetic shielding 100 along line A-A, and FIG. 3 is a perspective view of the electromagnetic shielding 100. The electromagnetic shielding 100 exhibits various advantages over conventional structures used to shield electronic equipment from EMI. As will be described in greater detail herein, the electromagnetic shielding 100 is flexible yet durable, such that the electromagnetic shielding 100 can be draped over a selected piece of electrical equipment and/or a selected group of electrical equipment (such as an individual server computing device or a selected group of server computing devices). In contrast, conventional approaches for shielding electrical equipment from EMI in data centers involve shielding entire buildings or rooms. In addition, the electromagnetic shielding 100 is relatively lightweight, such that the electromagnetic shielding 100 can be readily moved so that a technician is able to quickly access electrical equipment that is being shielded from EMI by the electromagnetic shielding 100. Moreover, the electromagnetic shielding 100 is inexpensive to manufacture and install when compared to conventional approaches for shielding electrical equipment in datacenters from EMI, such as structures for enclosing racks of servers. Still further, and as will be described in greater detail herein, the electromagnetic shielding 100 includes apertures through which air can flow, thereby preventing heat generated by electrical equipment from being confined by the electromagnetic shielding 100. Put differently, air is able to freely flow through the apertures in the electromagnetic shielding 100.

The electromagnetic shielding 100 includes several layers of different materials, where the layers include a layer of (nonmagnetic) metal. The layer of metal can be, in an example, aluminum, copper, or other similar nonmagnetic metal (in the form of a foil). The layers additionally include a layer of thermoplastic polymer fabric. The thermoplastic polymer fabric can be a woven polyethylene fabric, a paraffin fabric, or other suitable thermoplastic polymer fabric. The layer of metal and the layer of thermoplastic polymer fabric may be relatively thin; for instance, the layer of metal may be approximately 0.02 millimeters thick, and the layer of thermoplastic polymer fabric may be approximately 2 millimeters thick. In another example, the layer of metal may be non-perforated aluminum foil that can be woven with a fabric to prevent ripping, such that the layer of metal (optionally woven with fabric) is approximately 2 millimeters thick. It is to be understood, however, that the layer of metal and the layer of thermoplastic polymer fabric may be thinner or thicker than 2 millimeters. In an example, the layer of metal is between 0.01 millimeter thick and 10 millimeters thick, and the layer of thermoplastic polymer fabric is between 1 millimeter thick and 10 millimeters thick. The layer of metal and the layer of thermoplastic polymer fabric are bonded together by way of a suitable adhesive. The layer of thermoplastic polymer fabric provides structural support for the electromagnetic shielding 100.

The electromagnetic shielding 100 includes several apertures 102 that extend through a thickness of the electromagnetic shielding 100. Accordingly, the apertures 102 extend through the layer of metal and the layer of thermoplastic polymer fabric. The apertures 102 can have any suitable shape so long as the shape is associated with EMI attenuation. For example, the electromagnetic shielding attenuates EMI by a threshold amount when the EMI has a frequency within a predefined frequency range (such as 9 kHz-24 GHz). As illustrated in FIG. 1, the apertures 102 are hexagonal and are arranged in the electromagnetic shielding 100 in a honeycomb pattern. Hence, the electromagnetic shielding 100 has a honeycomb waveguide pattern to capture and absorb energy. In other embodiments, however, the apertures 102 can have a "near hexagonal" shape, a circular shape, or other suitable polygonal shape.

The apertures 102 have a major diameter D that is a function of frequencies that are to be attenuated by the electromagnetic shielding 100. In an example, the major diameter D is between 4 millimeters and 15 millimeters. In a specific example, the major diameter D of the apertures 102 is approximately 6.4 millimeters. Further, each aperture in the apertures 102 can be separated from any other aperture in the apertures 102 by a minimum separation distance S. Such separation distance can be, for example, between 0.1 and 1 millimeters. Still further, the electromagnetic shielding 100 has a thickness T, where the thickness T can be between 10 millimeters and 30 millimeters. In a specific example, the thickness T is approximately 19 millimeters. As will be described in greater detail below, several layers of metal and or thermoplastic polymer fabric can be adhered together until the desired thickness T is achieved.

Figure 4:
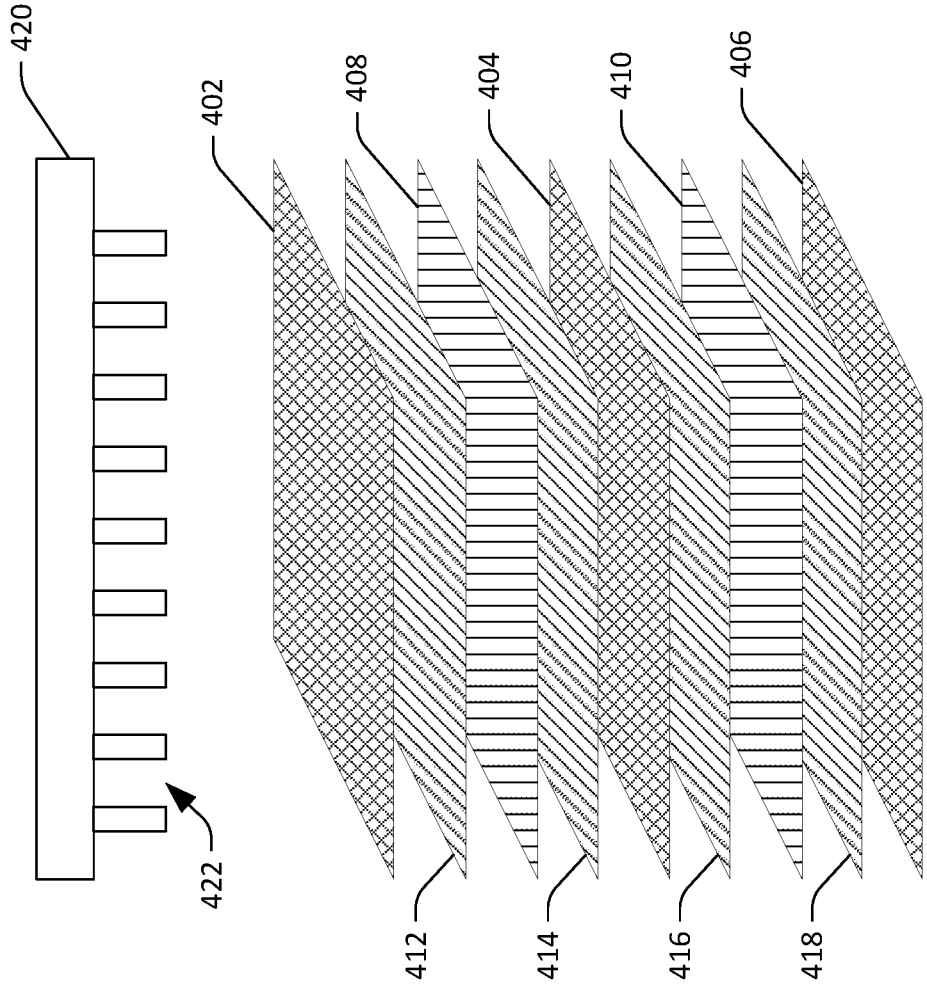
FIG. 4 depicts layers of materials in the electromagnetic shielding.

Referring now to FIG. 4, an exploded view diagram depicting manufacture of the electromagnetic shielding 100 is illustrated. As noted above, the electromagnetic shielding 100 includes several layers of different materials. In the example illustrated in FIG. 4, the electromagnetic shielding 100 includes a first layer of metal 402, a second layer of metal 404, and a third layer of metal 406. The electromagnetic shielding 100 also includes a first layer of thermoplastic polymer fabric 408 and a second layer of thermoplastic polymer fabric 410. The electromagnetic shielding 100 also includes a first layer of adhesive 412, a second layer of adhesive 414, a third layer of adhesive 416, and a fourth layer of adhesive 418. The first layer of adhesive 412 bonds the first layer of metal 402 with the first layer of thermoplastic polymer fabric 408, the second layer of adhesive 414 bonds the first layer of thermoplastic polymer fabric 408 with the second layer of metal 404, the third layer of adhesive 416 bonds the third layer of metal 404 with the second layer of thermoplastic polymer fabric 410, and the fourth layer of adhesive 418 bonds the second layer of thermoplastic polymer fabric 410 with the third layer of metal 406. Hence, the first layer of thermoplastic polymer fabric 408 is positioned between the first layer of metal 402 and the second layer of metal 404, and the second layer of thermoplastic polymer fabric 410 is positioned between the second layer of metal 404 and the third layer of metal 406. While the layers of adhesive are shown as being planar for purposes of illustration, it is to be understood that the adhesive need not be planarly applied; rather, adhesive in a pattern can be employed to adhere different layers to one another. A number of layers of thermoplastic polymer fabric and or layers of metal can be a function of thickness of such layers and a desired thickness of the electromagnetic shielding 100. Accordingly, presuming that the layers of adhesive 412-418 have no measurable thickness and presuming the thermoplastic and metal layers each have 1 millimeter thickness, then when the thickness of the electromagnetic shielding 100 is desirably 20 millimeters, the electromagnetic shielding 100 may have 10 layers of thermoplastic polymer fabric and 10 layers of metal. Each layer of metal provides redundancy for purposes of electromagnetic shielding, such that if one layer of metal is damaged, other layers of metal can nevertheless provide electromagnetic shielding.

While the electromagnetic shielding 100 depicted in FIG. 4 is illustrated as with the first layer of metal 402 and the third layer of metal 406 being exterior surfaces of the electromagnetic shielding 100, in other embodiments a layer of thermoplastic polymer fabric may be at least one exterior surface of the electromagnetic shielding 100. Pursuant to an example, both exterior surfaces of the electromagnetic shielding 100 may be layers of thermoplastic polymer fabric.

FIG. 4 further depicts a press 420 that has perforating extensions 422 extending therefrom. Upon the layers of metal 402-406 and the layers of thermoplastic polymer fabric 408-410 being adhered together, the press 420 is applied to the adhered layers and the perforating extensions perforate the stacked layers 402-410, such that the apertures 102 are formed through each of the layers 402-410. As indicated above, the layers of metal 402-406 and the apertures formed by the press 420 are configured to attenuate, by a threshold amount (such as −85 dB), EMI having frequencies within a predefined range (such as between 9 kHz and 24 GHz). The layers of thermoplastic polymer fabric 408-410 are configured to provide structural support to the layers of metal 402-406 while additionally providing flexibility for the electromagnetic shielding 100. Thus, as we will be described below, the electromagnetic shielding 100 can be draped over electronic equipment in a data center, where it is desirable to shield the electronic equipment from EMI having frequencies within the predefined range.

Figure 5:
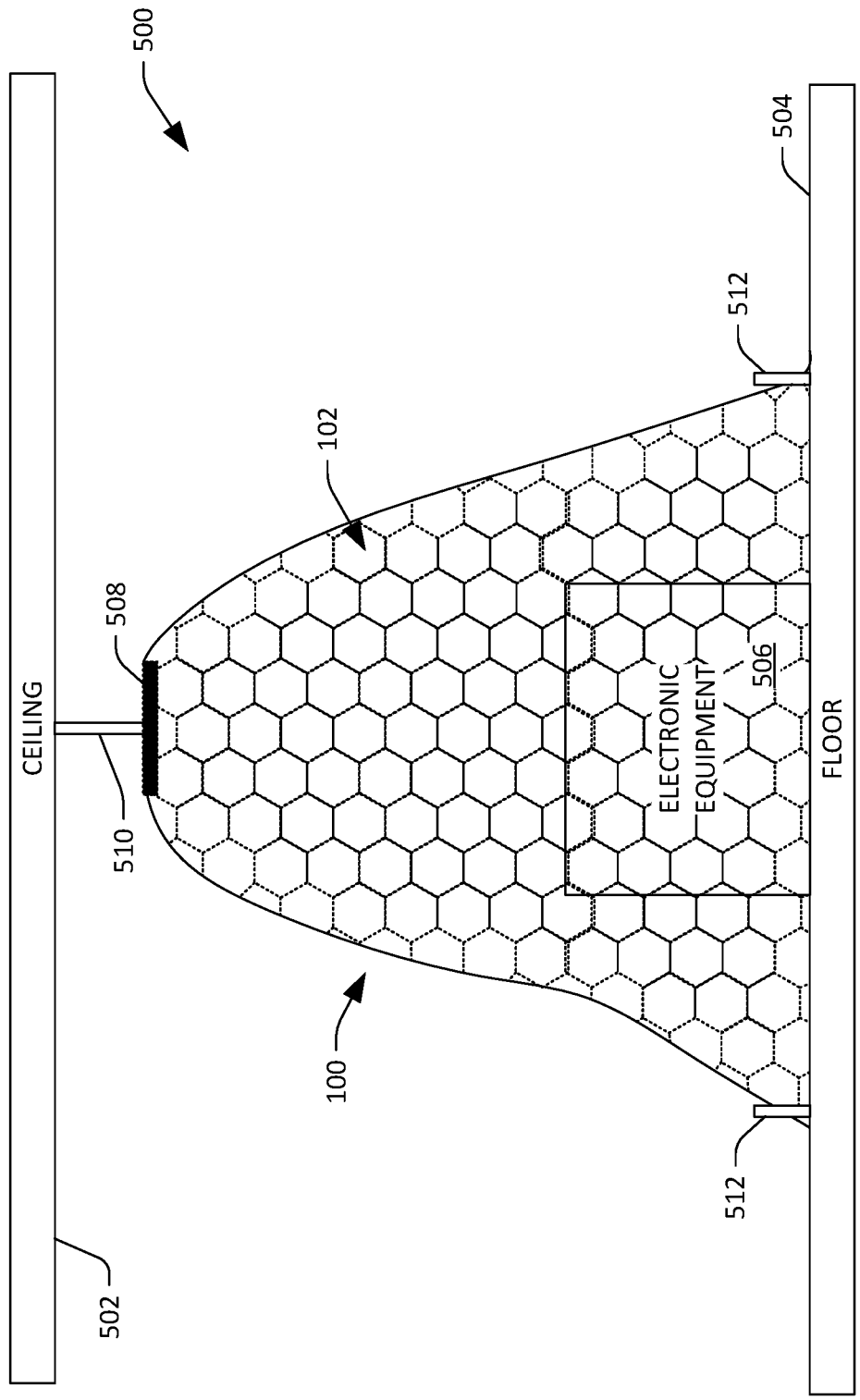
FIG. 5 illustrates electromagnetic shielding being draped over electronic device to shield the electronic equipment from EMI.

FIG. 5 is a schematic of an environment 500 in a data center (such as a room in the data center) where electronic equipment is desirably shielded from EMI. The environment 500 includes a ceiling 502 and a floor 504, where electronic equipment 506 (such as a server computing device, a rack of server computing devices, etc.) is supported by the floor 504. The environment 500 further includes the electromagnetic shielding 100, where the electromagnetic shielding 100 is draped over the electronic equipment 506 to shield the electronic equipment 506 from EMI. A plate 508 is coupled to the ceiling 502 by way of an attachment 510, such as a rope, a plastic post anchored to the ceiling 502, etc. In embodiments, the plate 508, the attachment 510, or both plate 508 and attachment 510 are nonconductive. The plate 508 supports the electromagnetic shielding 100 such that the electromagnetic shielding 100 is able to be draped over the electronic equipment 506, while maintaining a desired separation distance between the electronic equipment 506 and the electromagnetic shielding 100. For instance, a minimum separation distance of 150 millimeters can be maintained between the electromagnetic shielding 100 and the electronic equipment 506.

Anchors 512 can be employed to anchor the electromagnetic shielding 100 to the floor 504 to ensure that the electronic equipment 506 is enclosed by a combination of the electromagnetic shielding 100 and the floor 504. In an example, when the electronic equipment 506 is positioned on an upper floor in a building, the floor 504 can be separately shielded. Typically, however, the electronic equipment 506 is positioned on a concrete slab on grade. The anchors 512 can also be employed to shape the electromagnetic shielding 100 as the electromagnetic shielding 100 is draped over the electronic equipment 506, such that the threshold distance between the electromagnetic shielding 100 and the electronic equipment 506 is maintained. Further, the anchors 512 may be grounding anchors, such that current imparted upon the electromagnetic shielding 100 by EMI is directed to ground. The electromagnetic shielding 100 prevents EMI generated by the electronic equipment 506 from propagating to other electronic equipment in the data center. The electromagnetic shielding 100 is further configured to prevent EMI generated by other electronic equipment (or an outside source) from deleteriously affecting the electronic equipment 506. As illustrated in FIG. 5, the apertures 102 in the electromagnetic shielding 100 allow for air to flow from the region that is enclosed by the electromagnetic shielding 100 and the floor 504 to the exterior environment. Accordingly, standard hot aisle/cold aisle methods typically used in data centers can be employed while the electromagnetic shielding shields the electronic equipment 506 from EMI.

Figure 6:
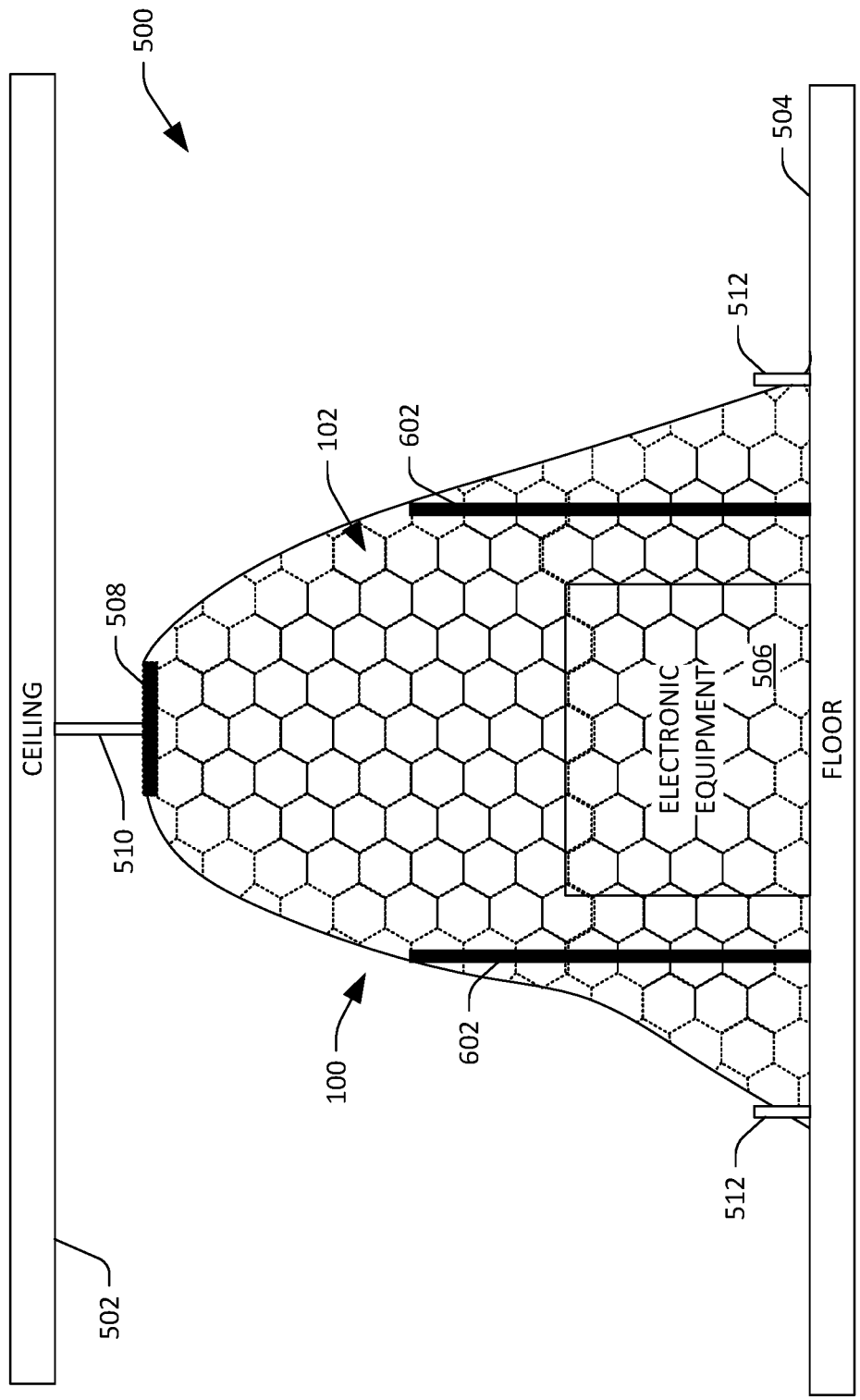
FIG. 6 illustrates electromagnetic shielding being draped over an electronic device in a data center, where supports are employed to shape the electromagnetic shielding.

Turning briefly to FIG. 6, the environment 500 is illustrated, where support posts 602 extend from the floor 504 to support the electromagnetic shielding 100. The support posts 602 provide physical support to the electromagnetic shielding 100 to prevent stretching of the fabric (and the apertures 102). The support posts 602 can be formed of any suitable nonconductive material, such as a plastic. While not illustrated, in a situation where the electromagnetic shielding 100 must have a sharp corner (e.g., because of the nature or shape of the electronic equipment 506 that is to be shielded from EMI and/or physical constraints of the environment), a cornering bracket (or other suitable apparatus) can be used, and two separate pieces of electromagnetic shielding 100 can coupled to the bracket to prevent stretching of the electromagnetic shielding 100. When a technician needs to access the electronic equipment 506, the technician can remove the anchors 512 (if such anchors 512 are used) and lift the electromagnetic shielding 100 to obtain access to the electronic equipment 506. Upon completing a maintenance task, the technician can replace the anchors 512, such that the electromagnetic shielding 100 returns to being draped over the electronic equipment 506.

While FIGS. 5 and 6 depict the electromagnetic shielding 100 being draped over the electronic equipment 506, it is to be understood that the equipment that the electromagnetic shielding 100 may be wrapped around includes wires between the wrapped equipment, to prevent data leakage or EMI from such wires, even if they are not themselves wrapped with other electromagnetic shielding.

Figure 7:
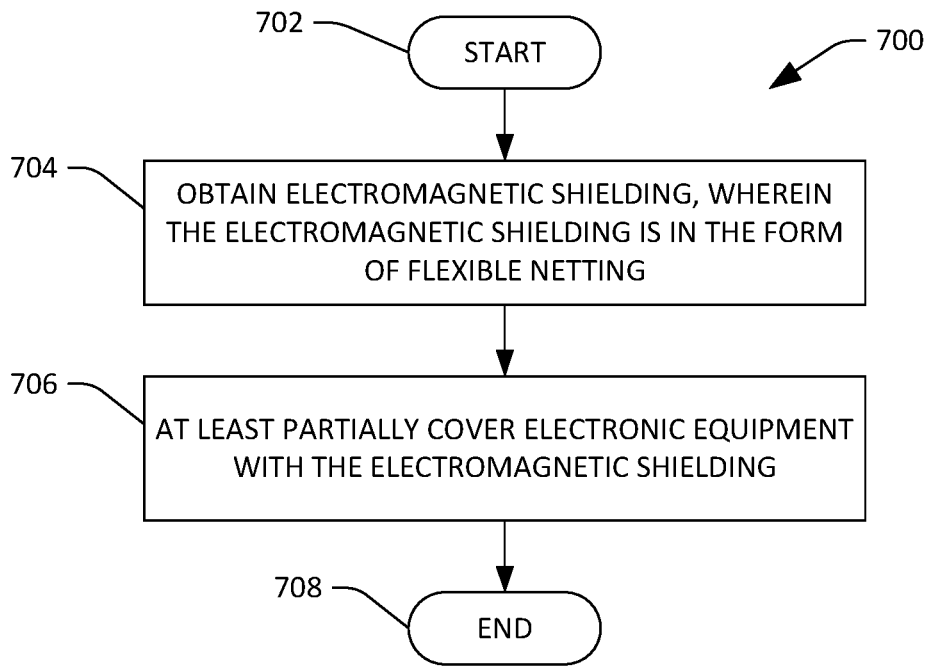
FIG. 7 a flow diagram that illustrates an exemplary methodology for shielding an electronic device in a data center from EMI.
Figure 8:
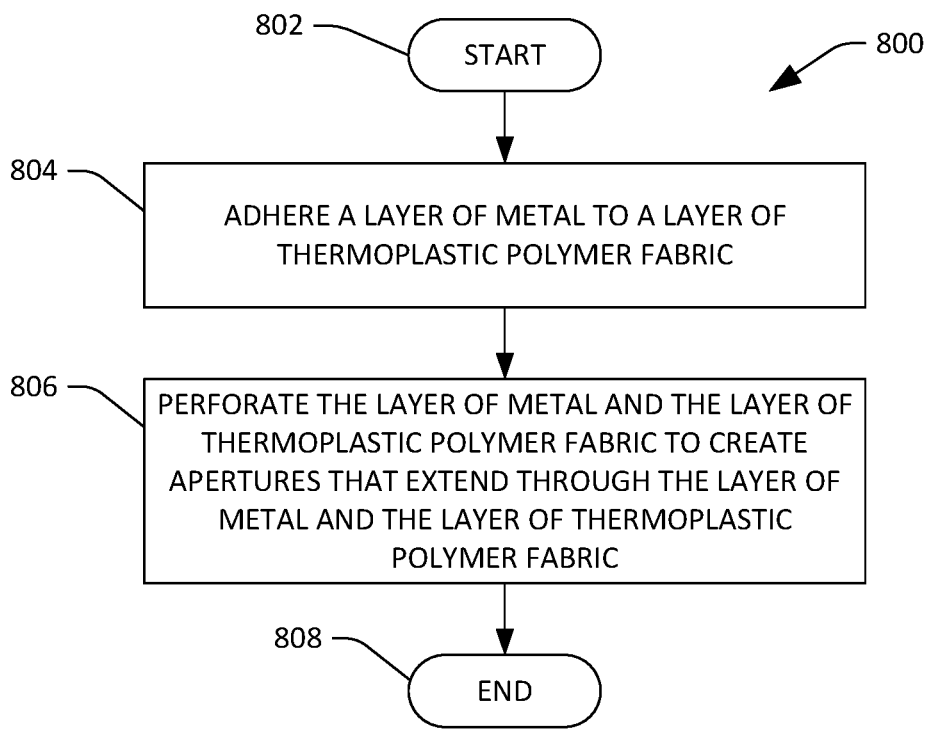
FIG. 8 is a flow diagram that illustrates an exemplary methodology for forming electromagnetic shielding.

FIGS. 7 and 8 illustrate exemplary methodologies relating to use and manufacture of electromagnetic shielding. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Now referring to FIG. 7, a methodology 700 for shielding electronic equipment in a data center from EMI is illustrated. The methodology 700 starts at 702, and at 704 electromagnetic shielding is obtained, where the electromagnetic shielding is in the form of a flexible netting. The electromagnetic shielding includes a layer of metal and a layer of thermoplastic polymer fabric that is adhered to the layer of metal by a suitable adhesive. As described previously, several apertures extend through the electromagnetic shielding, where the layer of metal and the several apertures are configured to attenuate EMI by at least a threshold amount when the EMI has a frequency within a predefined frequency range, while simultaneously enabling airflow through the electromagnetic shielding. In an example, when honeycomb cells of the electromagnetic shielding have approximately ⅛ inch major diameter and approximately 1 inch of thickness, when air flow is approximately 200 Feet Per Minute (FPM) there is a static pressure drop of 0.01; when air flow id approximately 800 FPM, there is a static pressure drop of 0.04. When honeycomb cells of the electromagnetic shielding have approximately 3/16 inch major diameter and approximately 1 inch of thickness, when air flow is approximately 200 FPM there is almost no static pressure drop, while when air flow is approximately 800 FPM there is a static pressure drop of 0.03. At 706, the electronic equipment is at least partially covered with the electromagnetic shielding. As noted above, the electromagnetic shielding can be supported from above the electronic equipment and is draped over the electronic equipment. The methodology 700 completes at 708.

Now referring to FIG. 8, a methodology 800 for manufacturing electromagnetic shielding is illustrated. The methodology 800 starts at 802, and at 804 a layer of metal (such as aluminum foil) is adhered to a layer of thermoplastic polymer fabric (such as a woven polyethylene fabric). At 806, the layer of metal and the layer of thermoplastic polymer fabric are perforated to create apertures that extend through the layer of metal and the layer of thermoplastic polymer fabric. The layer of metal and the several apertures are configured to attenuate EMI by a threshold amount when the EMI has a frequency within a predefined frequency range. As indicated previously, the apertures may be hexagonal, and may collectively form a honeycomb pattern. The methodology 800 completes at 808.

Features have been described herein in accordance with at least the following examples.

(A1) In an aspect, electromagnetic shielding that is configured to attenuate EMI is described herein. The electromagnetic shielding includes a layer of metal, a layer of thermoplastic polymer fabric, and an adhesive that adheres the layer of metal to the layer of thermoplastic polymer fabric. Several apertures extend through the electromagnetic shielding, where the layer of metal and the several apertures are configured to attenuate EMI by a threshold amount when the EMI has a frequency within a predefined frequency range.

(A2) In some embodiments of the electromagnetic shielding of (A1), the layer of metal is formed of aluminum, and the layer of metal has a thickness of between 0.01 millimeter and 10 millimeters.

(A3) In some embodiments of the electromagnetic shielding of at least one of (A1)-(A2), the layer of the thermoplastic polymer fabric is woven polyethylene fabric, and the layer of the thermoplastic polymer has a thickness of between 1 millimeter and 10 millimeters.

(A4) In some embodiments of the electromagnetic shielding of at least one of (A1)-(A3), the layer of metal includes a first surface and a second surface that is opposite the first surface, where the adhesive layer adheres the layer of thermoplastic polymer to the first surface of the layer of metal. Additionally, the electromagnetic shielding also includes a second layer of thermoplastic polymer fabric and second adhesive that adheres the second surface of the layer of metal to the second layer of thermoplastic polymer fabric such that the layer of metal is between the layer of thermoplastic polymer fabric and the second layer of thermoplastic polymer fabric.

(A5) In some embodiments of the electromagnetic shielding of at least one of (A1)-(A4), the electromagnetic shielding also includes a second layer of metal, where the layer of thermoplastic polymer fabric is positioned between the layer of metal and the second layer of metal.

(A6) In some embodiments of the electromagnetic shielding of (A1), the electromagnetic shielding includes several layers of metal and several layers of thermoplastic polymer fabric, where each layer of metal is disposed between two layers of thermoplastic polymer fabric.

(A7) In some embodiments of the electromagnetic shielding of at least one of (A1)-(A6), the apertures are hexagonal.

(A8) In some embodiments of the electromagnetic shielding of at least one of (A1)-(A7), the several apertures are arranged to form a honeycomb pattern.

(A9) In some embodiments of the electromagnetic shielding of at least one of (A1)-(A8), each aperture in the several apertures has a major diameter of between 4 millimeters and 15 millimeters.

(A10) In some embodiments of the electromagnetic shielding of at least one of (A1)-(A9), the electromagnetic shielding has a thickness in a direction that is orthogonal to the layer of metal and the layer of thermoplastic material, the thickness being between 10 millimeters and 26 millimeters.

(A11) In some embodiments of the electromagnetic shielding of at least one of (A1)-(A10), the apertures are formed in the electromagnetic shielding subsequent to the layer of metal being adhered to the layer of thermoplastic polymer fabric.

(B1) In another aspect, a method for protecting electronic equipment from EMI includes obtaining electromagnetic shielding, where the electromagnetic shielding includes a layer of metal, a layer of thermoplastic polymer fabric that is adhered to the layer of metal, and several apertures that extend through the electromagnetic shielding. The layer of metal and the several apertures are configured to attenuate EMI by a threshold amount when the EMI has a frequency within a predefined frequency range. The method also includes at least partially covering the electronic equipment with the electromagnetic shielding.

(B2) In some embodiments of the method of (B1), at least partially covering the electronic equipment includes supporting the electromagnetic shielding with a support mechanism that is positioned above the electronic equipment. The method also includes draping the electromagnetic shielding around the electronic equipment.

(B3) In some embodiments of the method of (B2), the support mechanism is affixed to a ceiling.

(B4) In some embodiments of at least one of the methods of (B1)-(B3), the method also includes coupling the electromagnetic shielding to a grounding rod.

(B5) In some embodiments of at least one of the methods of (B1)-(B4), the electronic equipment is a server computing device within a data center.

(B6) In some embodiments of at least one of the methods of (B1)-(B4), the electronic equipment is a rack of servers within a data center.

(B7) In some embodiments of at least one of the methods of (B1)-(B6), the electromagnetic shielding has a thickness between 10 millimeters and 26 millimeters.

(C1) In another aspect, a method for manufacturing electromagnetic shielding that is configured to attenuate EMI includes adhering a layer of metal to a layer of thermoplastic polymer fabric. The method also includes perforating the layer of metal and the layer of thermoplastic polymer fabric to create apertures that extend through the layer of metal and the layer of thermoplastic polymer fabric, where the layer of metal and the several apertures are configured to attenuate EMI by a threshold amount when the EMI has a frequency within a predefined frequency range.

(C2) In some embodiments of the method of (C1), the threshold amount is between −70 and −90 dB of attenuation, and the predefined frequency range is 9 kHz-24 GHz.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. Electromagnetic shielding that is configured to attenuate electromagnetic interference (EMI), the electromagnetic shielding comprising:
    several layers of metal;
    several layers of thermoplastic polymer fabric, where each layer of metal is disposed between two layers of thermoplastic polymer fabric; and
    an adhesive that adheres a layer of metal in the several layers of metal to two layers of thermoplastic polymer fabric in the several layers of thermoplastic polymer fabric, wherein several apertures extend through the electromagnetic shielding, wherein the electromagnetic shielding is configured to attenuate EMI by a threshold amount when the EMI has a frequency within a predefined frequency range.

2. The electromagnetic shielding of claim 1, wherein the layer of metal is formed of aluminum, and further wherein the layer of metal has a thickness of between 0.01 millimeter and 10 millimeters.

3. The electromagnetic shielding of claim 1, wherein a layer thermoplastic polymer fabric in the layers of the thermoplastic polymer fabric is woven polyethylene fabric, and further wherein the layer of the thermoplastic polymer has a thickness of between 1 millimeter and 10 millimeters.

4. The electromagnetic shielding of claim 1, wherein the layer of metal includes a first surface and a second surface that is opposite the first surface, wherein the adhesive layer adheres a layer of thermoplastic polymer to the first surface of the layer of metal, and further wherein
    a second adhesive layer adheres the second surface of the layer of metal to a second layer of thermoplastic polymer fabric such that the layer of metal is between the layer of thermoplastic polymer fabric and the second layer of thermoplastic polymer fabric.

5. The electromagnetic shielding of claim 1, wherein the apertures are hexagonal.

6. The electromagnetic shielding of claim 1, wherein the several apertures are arranged to form a honeycomb pattern.

7. The electromagnetic shielding of claim 1, wherein each aperture in the several apertures has a major diameter of between 4 millimeters and 15 millimeters.

8. The electromagnetic shielding of claim 1 having a thickness in a direction that is orthogonal to the several layers of metal and the several layers of thermoplastic material, the thickness being between 10 millimeters and 26 millimeters.

9. The electromagnetic shielding of claim 1, wherein the apertures are formed in the electromagnetic shielding subsequent to the layer of metal being adhered to the two layers of thermoplastic polymer fabric.

10. The electromagnetic shielding of claim 1, wherein the threshold amount is between −70 and −90 dB of attenuation, and the predefined frequency range is 9 kHz-24 GHz.

11. A method for forming electromagnetic shielding that is configured to attenuate electromagnetic interference (EMI), the method comprising:
    obtaining several layers of metal;
    obtaining several layers of thermoplastic polymer fabric;
    disposing each layer of metal between two layers of thermoplastic polymer fabric; and
    adhering a layer of metal in the several layers of metal to two layers of thermoplastic polymer fabric in the several layers of thermoplastic polymer fabric, wherein several apertures extend through the electromagnetic shielding, wherein the electromagnetic shielding is configured to attenuate EMI by a threshold amount when the EMI has a frequency within a predefined frequency range.

12. The method of claim 11, wherein the layer of metal is formed of aluminum, and further wherein the layer of metal has a thickness of between 0.01 millimeter and 10 millimeters.

13. The method of claim 11, wherein a layer thermoplastic polymer fabric in the layers of the thermoplastic polymer fabric is woven polyethylene fabric, and further wherein the layer of the thermoplastic polymer has a thickness of between 1 millimeter and 10 millimeters.

14. The method of claim 11, wherein the layer of metal includes a first surface and a second surface that is opposite the first surface, wherein the adhesive layer adheres a layer of thermoplastic polymer to the first surface of the layer of metal, and further wherein a second adhesive layer adheres the second surface of the layer of metal to a second layer of thermoplastic polymer fabric such that the layer of metal is between the layer of thermoplastic polymer fabric and the second layer of thermoplastic polymer fabric.

15. The method of claim 11, wherein the apertures are hexagonal.

16. The method of claim 11, wherein the several apertures are arranged to form a honeycomb pattern.

17. The method of claim 11, wherein each aperture in the several apertures has a major diameter of between 4 millimeters and 15 millimeters.

18. The method of claim 11, wherein the electromagnetic shielding has a thickness in a direction that is orthogonal to the several layers of metal and the several layers of thermoplastic material, the thickness being between 10 millimeters and 26 millimeters.

19. The method of claim 11, wherein the apertures are formed in the electromagnetic shielding subsequent to the layer of metal being adhered to the two layers of thermoplastic polymer fabric.

20. A method for using electromagnetic shielding, the method comprising:
    obtaining the electromagnetic shielding, where the electromagnetic shielding comprises:
        several layers of metal;
        several layers of thermoplastic polymer fabric, where each layer of metal is disposed between two layers of thermoplastic polymer fabric; and
        an adhesive that adheres a layer of metal in the several layers of metal to two layers of thermoplastic polymer fabric in the several layers of thermoplastic polymer fabric, wherein several apertures extend through the electromagnetic shielding, wherein the electromagnetic shielding is configured to attenuate EMI by a threshold amount when the EMI has a frequency within a predefined frequency range; and
    at least partially covering electronic equipment with the electromagnetic shielding.

* * * * *